(12) United States Patent
Burgyan

(10) Patent No.: US 8,597,979 B1
(45) Date of Patent: Dec. 3, 2013

(54) PANEL-LEVEL PACKAGE FABRICATION OF 3D ACTIVE SEMICONDUCTOR AND PASSIVE CIRCUIT COMPONENTS

(71) Applicant: Lajos Burgyan, Mountain View, CA (US)

(72) Inventor: Lajos Burgyan, Mountain View, CA (US)

(*) Notice: Subject to any disclaimer, the term of this patent is extended or adjusted under 35 U.S.C. 154(b) by 0 days.

(21) Appl. No.: 13/950,227

(22) Filed: Jul. 24, 2013

Related U.S. Application Data

(60) Provisional application No. 61/755,585, filed on Jan. 23, 2013.

(51) Int. Cl.
*H01L 21/00* (2006.01)

(52) U.S. Cl.
USPC ........... 438/106; 438/124; 438/109; 438/384; 257/704; 257/686; 257/698; 257/703

(58) Field of Classification Search
USPC .......... 438/106, 124, 109, 384; 257/704, 304, 257/48, 668, 676, 686, 698, 703, 723
See application file for complete search history.

(56) References Cited

U.S. PATENT DOCUMENTS

| | | | | |
|---|---|---|---|---|
| 7,342,296 B2 * | 3/2008 | Yang et al. | .................... | 257/620 |
| 7,525,185 B2 * | 4/2009 | Yang et al. | .................... | 257/678 |
| 8,304,287 B2 * | 11/2012 | Yang | .................... | 438/109 |
| 8,350,377 B2 * | 1/2013 | Yang | .................... | 257/692 |
| 2007/0072338 A1 * | 3/2007 | Yang et al. | .................... | 438/106 |
| 2007/0128835 A1 * | 6/2007 | Yang et al. | .................... | 438/464 |
| 2010/0078655 A1 * | 4/2010 | Yang | .................... | 257/81 |
| 2010/0301474 A1 * | 12/2010 | Yang | .................... | 257/737 |
| 2011/0156239 A1 * | 6/2011 | Jin | .................... | 257/692 |
| 2011/0256714 A1 * | 10/2011 | Yang | .................... | 438/652 |

* cited by examiner

*Primary Examiner* — Telly Green
(74) *Attorney, Agent, or Firm* — David E. Newhouse, Esq.

(57) ABSTRACT

Three dimensional Panel-Level Packaging (3D-PLP) fabrication techniques for mass-production of small, simple three dimensional electronic component packages or units such as a DC-DC Converters are described where each package or unit consists of at least an active semiconductor die and a passive, two-terminal electrical circuit element (capacitor inductor and/or resistor).

13 Claims, 12 Drawing Sheets

PANEL-LEVEL PACKAGE FABRICATION OF 3D ACTIVE SEMICONDUCTOR AND PASSIVE CIRCUIT COMPONENTS

RELATED APPLICATIONS

This Application claims all benefits applicable under 35 U.S.C. §119(e) related to U.S. Provisional Patent Application Ser. No. 61/755,585 filed by the Applicant on 23 Jan. 2013 entitled "Fabrication Method for Package Level Integration of Active and Passive Components", and incorporates U.S. Provisional Patent Application Ser. No. 61/755,585 in its entirety, by reference into this application.

BACKGROUND OF THE INVENTION

1. Field of the Invention

The present invention relates generally to methods for manufacturing three-dimensional (3D) multi-component electronic structures that consists of simple active and passive integrated circuit elements. More particularly, the present invention relates to fabricating a plurality of simple three dimensional electronic component packages such as a DC-DC converter in form panels where each package includes at least an active semiconductor die and a passive, two-terminal, electrical circuit component (capacitor inductor and/or resistor).

2. Description of the Prior Art

Three-dimensional (3D) integrated circuit fabrication techniques in the semiconductor industry where active semiconductor dies and passive electrical circuit elements are vertically stacked and interconnected to form high density integrated circuit modules have evolved to satisfy the demand for space-constrained, digital electronic devices such as smart phones, tablet computers, laptop computers and the like. Techniques for fabricating such high density 3D integrated circuit modules, variously referred to as Chip-Scale-Packages (CSPs), Multi-Chip-Modules (MCMs), Systems-in-a-Package (SIPs) and Wafer-Level-Chip-Scale-Packages (WLCSPs), all essentially require a combination of or the equivalent of:

- a carrier or substrate support surface;
- an adhesive film covering the support surface of the carrier;
- a layer of discreet contact pad arrays of electrically conductive material placed on the adhesive surface for a plurality of particular integrated circuit modules;
- an initial layer of discrete semiconductor dies and passive electrical components each having terminals registering with, and metallurgically and electrically connecting to particular contact pads in each discreet array of contact pads for each particular integrated circuit module;
- a temporary layer of a resist material covering the initial layer of arrays of discrete semiconductor and passive electrical components and vacant contact pads in each particular circuit module;
- via passages or openings penetrating through the temporary layer of resist material exposing the vacant contact pads, and exposing chosen terminals of the initial array of discrete semiconductor dies and passive electrical components;
- an electrically conductive pillar constructed in each via passage, and an electrically conductive bump placed on each exposed terminal of the semiconductor dies and passive electrical components, respectively metallurgically and electrically connecting to the exposed contact pads and to the exposed terminals;
- removal of the temporary layer of resist material exposing the initial array of contact pads, discrete semiconductor dies and passive electrical components with constructed electrically conductive pillars and bumps in each particular integrated circuit module;
- at least a second layer of discrete semiconductor dies and passive electrical components having terminals that register with and metallurgically and electrically connecting to the conductive constructed pillars extending up from the contact pads and to the conductive bumps extending up from the exposed terminals in each particular integrated circuit module;
- encapsulating the initial and second layers above the adhesive film covering the carrier substrate surface in a layer of electrically insulating, permanent wafer bonding material creating a layered structure containing a plurality of the particular integrated circuit modules;
- removal of a top layer of the electrically insulating, permanent wafer bonding material from the created structure for reducing the thickness of the layered structure;
- removal of the carrier substrate support surface, and the covering adhesive film exposing bottom faces of the conductive pad array on a bottom face of the created structure;
- an interconnect face (or lead frame) structure consisting of patterns electrically conductive material selectively interconnecting between the exposed bottom faces of the conductive pads in each particular integrated circuit module, and a layer of permanent electrically insulating material selectively covering the electrically conductive interconnect pattern of each particular integrated circuit module;
- an array of conductive bumps connecting metallurgically and electrically to exposed sections of the conductive interconnect pattern of each particular integrated circuit module; and
- singulation of the discreet integrated circuit modules formed in the created structure.
- (See generally U.S. Pat. No. 8,288,201, Pagaila et al. entitled "SEMICONDUCTOR DEVICE AND METHOD OF FORMING FO-WLCSP WITH DISCRETE SEMICONDUCTOR COMPONENTS MOUNTED UNDER AND OVER SEMICONDUCTOR DIE" & U.S. Pat. No. 8,222,716, J. A. Bayan, entitled "MULTIPLE LEAD FRAME PACKAGE".)

While a myriad of different types of small inductors, resistors and capacitors can and have been incorporated into such integrated circuit modules, there are limitations. Existing package level integration techniques incorporating such components involve either costly manufacturing processes, high tooling costs, or both. Also, in applications where load currents are in excess of 100 mA and switching waveforms have rise- and fall times in the few nanoseconds (ns) range as in the case of advanced electronic DC-DC converters, the drawbacks are electronic noise (EMI & RFI), complexity, and expense.

DC-DC converters are essential both in space-constrained digital devices powered by rechargeable batteries such as smart phones, tablet computers, laptop computers, and in larger digital systems that have multiple subsystems, e.g. desk top computers, where the different subsystems require power at different voltages.

There are different topologies of DC-DC converters, the most common being a step-down or 'Buck' topology where output voltage less is than the input voltage, a step-up or 'Boost' topology where the output voltage is greater than the input voltage and a "single-ended primary-inductor" converter (SEPIC) or 'Buck-Boost' topology where output voltage can be greater or less that the input voltage.

For space-constrained digital devices powered by internal, rechargeable batteries or solar cells, DC-DC converters offer a very small and efficient method of producing a precisely controlled voltage output. In particular, the voltage output of battery power sources decreases across a range as charge depletes, and increases across that range when connected with an external direct current recharging power source. A DC-DC converter receives the energy from such variable DC power outputs, stores that energy in either in the magnetic field of an inductor component and/or an electrical field of a capacitor component, and then outputs that energy at either a higher or a lower output voltage levels as required by the particular integrated circuit module with which it is interconnected whether digital or analog.

In larger digital systems, each IC subsystem may require energy at a particular voltage to properly function. In this case the DC-DC converter receives DC energy input from voltage output of a power supply for the system and outputs that energy at an optimum voltage for the proper function of the module it is serving.

In short, there is a high demand for small, reliable DC-DC converters and similar simple electronic circuit packages that include at least an active semiconductor die controller and a passive, two-terminal, electrical circuit component in the electronic industry. They are essential to, but cannot be effectively or practically incorporated into more complex integrated circuitry modules. Also, current state-of-the art DC-DC converter packages and similar packages currently being interconnected with complex integrated circuitry modules are expensive, hard to interconnect, and ill-suited for mass production.

In particular, looking FIG. 1A illustrating an existing state-of-the-art lead frame package for a DC-DC converter 109 that includes an integrated circuit (IC) controller, 101, an inductor 102, and a capacitor, 103, arranged on top of an etched copper lead frame 104. The IC controller 101 is wire bonded to the lead frame 104. The passive, two-terminal circuit components (inductor 102 & capacitor 103) are soldered on the lead frame 104. The entire assembly is over-molded with a permanent, electrically insulating molding material 109 using conventional map-molding tools developed for the fabrication of QFN (Quad Flat No-lead) or DFN (Dual Flat No Lead) packages. Typically, in conventional QFN packages containing a single semiconductor die that dissipates significant amount of heat, the central portion of the lead frame is formed to have a large rectangular shape underneath the die, extending sideways, in order to facilitate heat transfer from the semiconductor die to the printed circuit board. The DC-DC converter module of FIG. 1A uses parts of the central portion of lead frame 104 to connect the terminals of passive components 102 and 103 to individual isolated segments of the etched lead frame. The disadvantages of such lead frame packaging relate to time and expense for creation of a copper lead frame interconnecting between the package components, and a fragmented exposed (and electrically conductive) bottom surface that complicates layout of underlying circuitry components, e.g., a printed circuit board (PCB). Fragmented lead frames also significantly reduce the removal rate of heat generated within the package. Also, the thickness of the molding material 109 electrically insulating and securing the inductive and capacitive components 102 & 103, and copper lead frame thickness (~200 μm) increase package height to non-optimal levels in space constrained destination systems. Finally, such packaging technology requires complicated and expensive tooling in order to accomplish injection over-molding of such structures for mass production.

FIG. 1B illustrates another state-of-the-art integrated DC-DC converter module, including a wafer-level chip scale package (WLCSP) integrated circuit controller (a semiconductor die) 105 having solder-bump terminals, placed, exposed, on top of an inductor 102. The inductor surface is patterned with edge plates 106 for interconnection. The main drawback of this approach is that it requires custom inductor designs, and a complex manufacturing flow, hence very expensive. The minimum achievable package height is also greater than 1 mm. Other drawbacks include fragility of the exposed semiconductor die 105 that is both thin and brittle and can be damaged by chipping and cracking when placed on an underlying printed circuit board (PCB) by pick-and-place machines prior to solder re-flow. High thermal resistance and light sensitivity are also potential concerns.

FIG. 1C illustrates a state-of-the-art package-level integrated DC-DC converter module, where die-embedding PCB substrate technology is used to encase the integrated circuit controller 101 and interconnection traces between the controller and an inductor 102 in an embedding PCB substrate laminate 107. This approach uses solder balls 108 to connect the die-embedded package to an underlying PCB a particular DC-DC converter module is attached to by the end-user. This type of module integrates an IC, inductor and two capacitors 103 into a single module. Drawbacks include a need to use die-embedded PCB substrate technology requiring copper electroplating that limit production to relatively small panels, hence significantly increase manufacturing costs.

FIG. 1D illustrates still another state-of-the-art package-level integrated DC-DC converter module, wherein die-embedding PCB substrate technology is used to encase an integrated circuit controller in an embedding PCB substrate laminate 107. Copper interconnection paths between the controller and an inductor are electroplated within the laminate. The die embedded PCB substrate laminate is then over-molded with electrically insulating material 109, encapsulating the passive circuit components. This approach uses a Land Grid Array (LGA) footprint to connect the die-embedded package subsystem to a PCB of a particular device. Major drawbacks of this approach are manufacturing cost relating to copper electroplating, small panels for mass-production, and injection molding tooling for over-molding the package. Also, the combination of laminate and over-molding the inductive components significantly increases the height of the package.

Finally, FIG. 1E illustrates a state-of-the-art package-level integrated DC-DC converter module, wherein an industry standard Dual Flat No-lead (DFN) packaged IC controller 110, is attached to an inductor 102 by means of an adhesive. The inductor 102 is specially designed with a channel-like cavity underneath, the DFN package. The inductor terminals 111 (at opposing ends of the inductor) are formed by edge plating. The inductor terminals 111 and the DFN device terminals 112 are co-planar, and are solder-connected to a conventional PCB by the end user. The electrical connection between the IC controller 110 and the inductor 102 are formed by copper interconnect traces on the PCB. The main drawbacks of this approach relate to customization of the inductor structure to provide edge plated inductor terminals 111 and a "channel" for receiving the IC controller 110. Also, fabrication of the DFN structures is expensive, time consuming, involve lead frames, wire bonding and over-molding with permanent electrically insulating molding materials.

SUMMARY OF THE INVENTION

A panel-level package technology for fabricating a plurality of simple, active semiconductor and passive electronic components in three-dimensional packages, i.e., 3D-PLP technology is described where an array of the largest perimeter component of those to be integrated into the package is encapsulated in a temporary bonding material for creating a base panel layer onto which successively smaller perimeter, package components are successively bonded on each underlying larger perimeter component then encapsulated in a permanent, electrically insulating, bonding material in successive panel layers stacked on the base panel layer. Simultaneously, conduction solder perimeter vias and solder bumps are constructing connecting in each successive panel layer to each terminal of each larger perimeter component in the preceding underlying panel layer and terminals of each successively smaller component in each subsequent panel layer in each panel such that each three dimensional electronic component package provides at least one face with coplanar terminals. The array of the constructed and encapsulated three-dimensional component packages are then singulated by: (i) ablating intersecting singulation channels along each side of each three dimensional component package penetrating down into and through the successive panel layers of permanent electrically insulating bonding material to the base panel layer of temporary bonding material, and then (ii) chemical dissolving the encapsulating temporary bonding material of the base panel layer. Electrical conduction paths or traces presented on surfaces of external ICs and PCBs of an electronic system interconnect with the coplanar terminals of the three-dimensional component packages (3D-PLPs) to functionally receive input from and provide output to the external electronic circuits of the digital or analog electronic system.

3D-PLP technology, as introduced and described herein, utilizes the latest organic adhesives, temporary adhesive materials, jet-dispensing, and laser ablation technologies, developed for the semiconductor industry in a unique and innovative combination, to create a new, innovative device packaging technology. The resulting packaging technology is particularly suitable, but not limited to, for the fabrication of miniature DC-DC converter modules containing active semiconductor devices and passive components. The use of such advanced materials and equipment, as demonstrated in the present invention, facilitate the creation of entirely new and unique manufacturing processes that in effect lead to further miniaturization and the realization of cost/performance benefits of electronic subsystems that was previously impossible to achieve.

A key element of the 3D-PLP manufacturing flow is the use of high-temperature tolerant temporary bonding materials developed for wafer thinning applications. For example, the temporary bonding material developed by Weblin Hong et al at Brewer Science, Inc. is used to secure the active faces of semiconductor wafers on carrier substrate surfaces for removal of wafer material from passive back surfaces of the wafers by back-grinding and/or chemical-mechanical-polishing (CMP) and/or for constructing through-wafer conduction via structures, interconnects, bumps and the like. The temporary bonding material used (a cycloolefin copolymer (COC) dissolved or dispersed in a solvent system) is de-bonded releasing the wafer from the carrier substrate by heating for softening/liquefying the bonding material and/or by chemical dissolution of the bonding material using solvents. [See U.S. Pat. No. 7,935,780, W. Hong et al, and subsequent divisional patents and related published divisional applications including but not limited to Pub. No. US 2012/0291938.]

The principle advantages of the described panel-level packaging fabrication technique are:

First, 3D-PLP technology eliminates the need for expensive product-specific tooling, such as conventional injection-mold tooling, tools, materials and processes used for lead frame forming. These old technologies are replaced by a simple manufacturing flow that relies heavily in advanced materials and adhesive technology;

Second, 3-D PLP manufacturing flow replaces precision saw-based singulation techniques with a simple chemical singulation process;

Third, mass production is facilitated, as large numbers of essential, relatively small, simple three-dimensional packages of active semiconductor dies, and passive electrical components, e.g. DC-DC 'buck' converters, can be simultaneously manufactured without having to interconnect the package components in the constructed packages. For example, using an industry standard 300 mm panel (wafer) size and a 2.5 mm×2.0 mm inductor size, 13,200 modules per panel can be fabricated. This is an order of magnitude larger number than current technology can produce;

Fourth, the stacking technique, placing and encapsulating smaller perimeter components on a previously encapsulated layer of larger perimeter components, and constructing electrically conductive perimeter vias connecting to the underlying component and bumps connecting to the overlying component provides a coplanar terminal face that enables the three-dimensional component package to be optimally located on external ICs or PCBs using surface conductions paths or traces pre-printed on passive surfaces of such external ICs and PCBs for functionally interconnecting the package components to receive input from and provide output to external electronic circuits.

Fifth, 3D-PLP technology uses minimal amounts (if any) of electrically or magnetically neutral (non-contributing) materials and components. For example: no molding compounds, no lead-frames are used. Only electrically active materials such as the IC, some solder, Cu post interconnect material, magnetic material and some insulating material is deployed using 3D-PLP technology. Consequently, more magnetic material or larger inductor size can be used, and for a given module package size, electrical performance improves significantly;

Sixth, 3D-PLP manufacturing flow eliminates the need for fabrication of customized passive components as it relies on the use of conventional (off-the-shelf) passives, thus significantly reducing manufacturing cost and shortening development cycle time;

Seventh, 3-D-PLP manufacturing flow allows fabrication of high-performance DC-DC converter module having integrated inductor with sub-millimeter package height; and Eighth, 3D-PLP fabrication techniques also simplify subsequent processing steps of the constructed three-dimensional component packages, in that the singulated component packages once singulated can be arranged in an array with the coplanar terminal face placed on and secured by an adhesive coated carrier surface, and be successively coated with conformal electrically insulative and conductive films for effectively shielding exterior electronic circuitry from electronic interference generated by properly functioning package components and visa versa;

Ninth, due to reduced package size, parasitic inductances associated with interconnect routing are reduced, thus improved performance and higher frequency operation are possible.

DESCRIPTION OF PREFERRED AND EXEMPLARY EMBODIMENTS

Figure 1A:
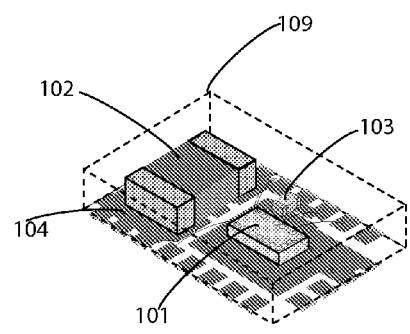
FIG. 1A-1E present features of existing state-of-the-art integrated DC-DC converter modules containing at least one passive component and one semiconductor die.
Figure 1B:
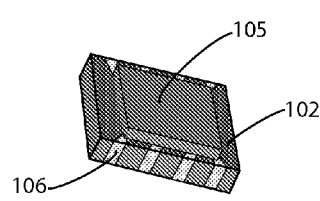
Figure 1C:
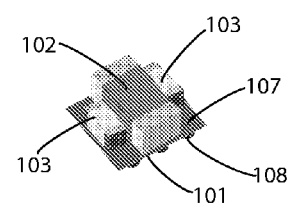
Figure 1D:
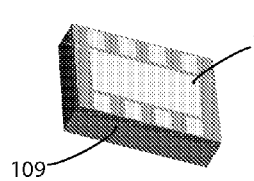
Figure 1E:
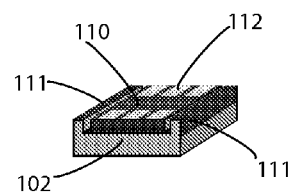
Figure 2:
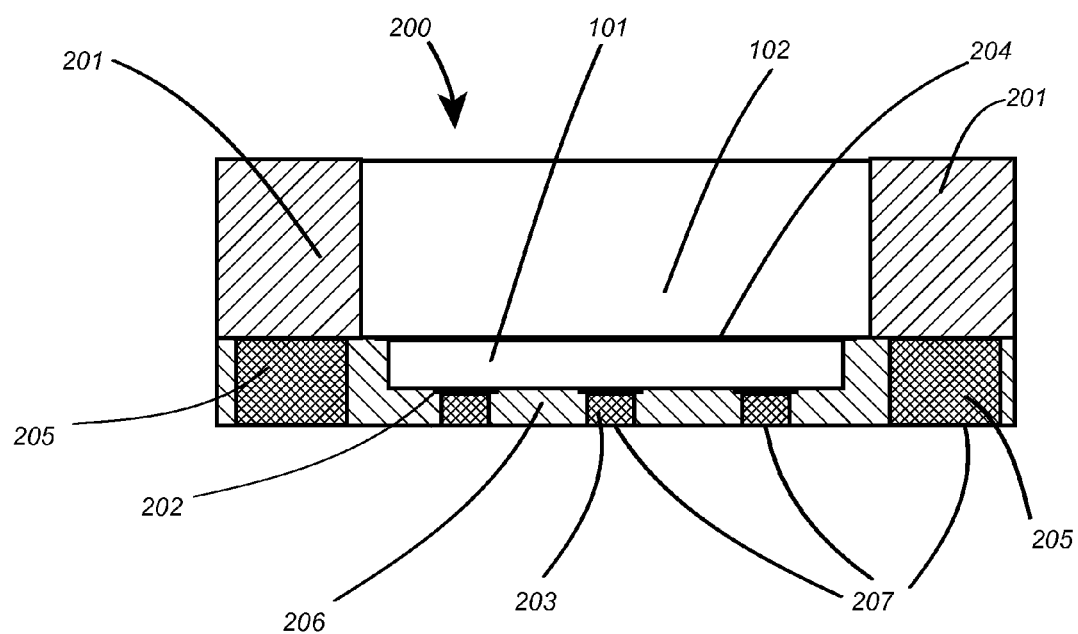
FIG. 2 illustrates features of a preferred embodiment of an exemplary three dimensional, DC-DC buck converter package mass-produced using 3D-PLP fabrication techniques.
Figure 3:
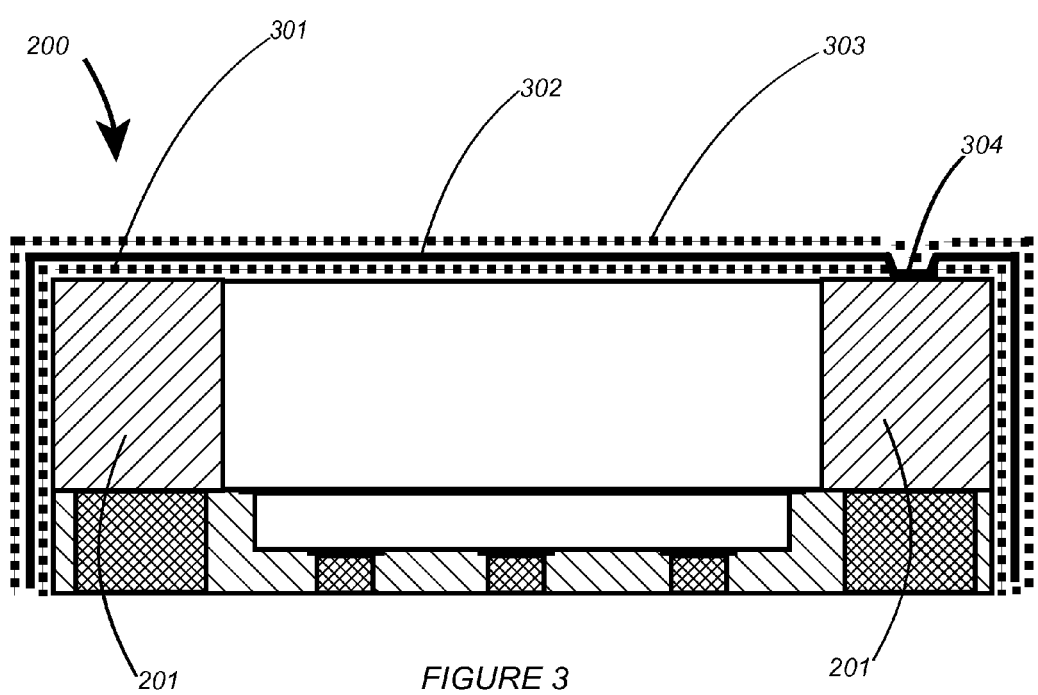
FIG. 3 illustrates advantages obtained for subsequent processing of the three dimensional, DC-DC buck converter package of FIG. 2.
Figure 4:
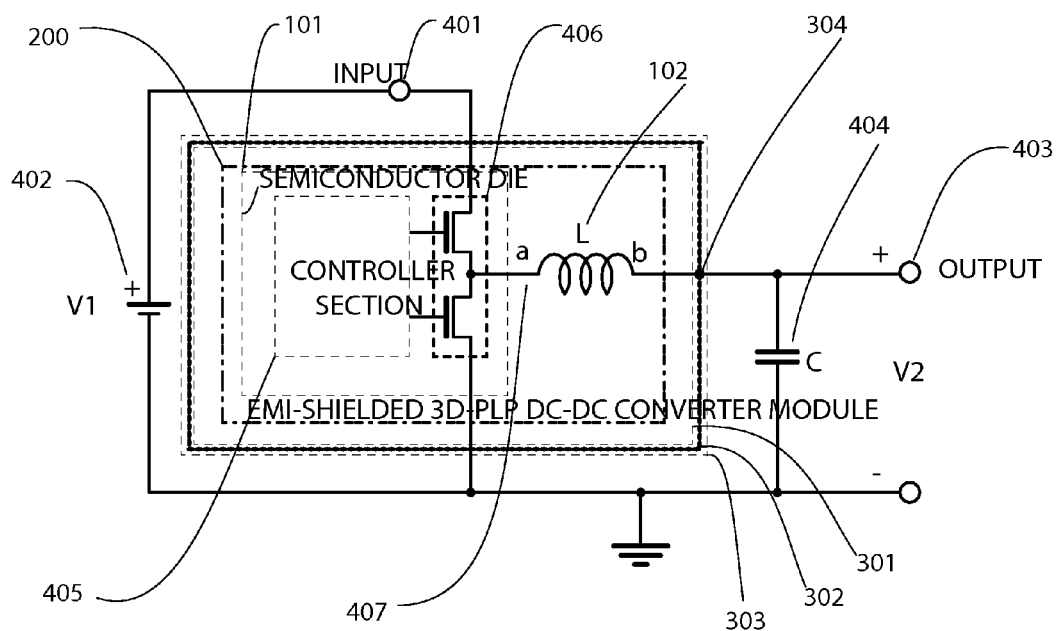
FIG. 4 is an electrical schematic representation of the interconnected DC-DC buck converter package of FIGS. 2 and 3.

Three-dimensional panel-level packaging is a particularly attractive approach for the creation of innovative miniature DC-DC converter packages using off-the-shelf inductors and integrated circuit semiconductor controller dies as illustrated in FIGS. 2-4. The perimeter dimensions of such inductors are typically around 2.5 mm by 2.0 mm with heights typically around 0.8 mm. Comparably sized semiconductor controller dies range perimeters range around 1.6 mm by 1.6 mm with heights typically around 125 µm. With Panel-level packaging techniques, DC-DC converters having sub-millimeter heights can be achieved using current off-the-shelf components.

In particular, as shown in FIG. 2, a singulated, miniature DC-DC converter panel-level package 200 with a coplanar bottom terminal face includes a conventional hexahedral inductor 102 and a semiconductor controller die 101. The hexahedral inductor 102 is the base of the package (the larger perimeter component). The hexahedral inductor 102 has two terminals 201, one at each end of the hexahedral body of the inductor 102. The controller die 101 (the smaller perimeter component) has a passive back face and an active front face with conventional terminals formed by conductive pads 202 and truncated solder balls, solder bumps, Cu pads and/or Cu pillars interconnects 203. As shown, the passive back face 204 of the controller die 101 is conventionally bonded to the bottom face of the hexahedral inductor 102 using a non-conductive die-attach epoxy. Conductive via structures 205 connect to the terminals 201 at each end of the inductor body 102. The controller die 101, the conductive pads 202 and interconnects 203 (a truncated solder ball, solder bump, Cu pad or Cu pillar) and the conductive via structures 205 connecting to the terminals 201 of the inductor 102 are all encapsulated in a panel of permanent insulating bonding material 206 bonded to the bottom face of the inductor 102. The bottom surface of the panel of permanent insulating bonding material 206 is planarized for establishing coplanar bottom terminal faces 207 of the package by truncating the ends of the conductive interconnects 203 and conductive structures 205, respectively, connecting to the controller die 101 and inductor 102.

FIG. 3 shows the DC-DC converter 200 following the application of subsequent optional processing steps (FIGS. 10, 11A-11C) of successive conformal coatings, 301, 302, 303, covering all the exterior surfaces of the converter 200 except the coplanar, bottom terminal face. Coatings 301 and 303 are electrically insulative coatings that preclude short circuit connection between the inductor terminals 201 and/or between those terminals 201 and surrounding conductive surfaces. Coating 302 between the insulative coatings 301 and 303 is an electromagnetic shield coating that electromagnetically isolates (shields) external electronic circuitry components from electromagnetic interference (EMI) generated by the DC-DC converter 200. As illustrated, the electromagnetic shield 302 is connected to an inductor terminal at location 304 (FIG. 3) that can be externally connected to a large bypass capacitor 404 (FIG. 4) of the particular electronic system. However, it should be appreciated that the optional electromagnetic conformal coating 302 and related optional insulative conformal conductive coatings 301 and 303 are only required to address application specific problems.

With reference to FIG. 4, illustrating an electrical schematic of a typical DC-DC 'buck' converter package 200, having its input terminal 401, connected to battery 402 and its output terminal 403 connected to bypass capacitor 404. The basic function of the circuit is to convert DC input voltage V1 to DC output voltage V2 where the output voltage V2 is less than the input voltage V1. As shown, the input voltage V1 is provided by a battery 402. With reference to FIG. 2, semiconductor die 101 is represented by a dashed rectangle in the schematic representation of FIG. 4. Semiconductor die 101 consists of controller section 405 and synchronous switch section 406. Controller section 405 performs the function of voltage regulation and the synchronous switch section 406 creates a rectangular waveform observable at circuit node 407. Circuit node 407 connects to terminal "a" of inductor 102. The rectangular waveform observable at circuit node 407 has peak-to-peak amplitude that is roughly equal to input voltage V1, however, its duty cycle varies depending upon the input to output voltage ratio.

Those skilled in the art know that the duty cycle of a 'buck' converter is defined as a ratio of the conduction (ON) time of the upper switch placed between the positive node of voltage source 402 and terminal "a" of the inductor 102 and the reciprocal value of the switching frequency. The rectangular switching waveform of circuit node 407 is required to have relatively fast rise and fall times in the several nanosecond ranges in order to ensure high efficiency of the DC-DC converter package. Thus, it follows from basic circuit theory that a rectangular waveform having fast rise and fall times will have very high frequency voltage components incorporated, often up to tens or hundreds of MHz frequency range. Such high frequencies can pose significant problems in RF communication systems that having highly sensitive input sections. Therefore in such applications EMI shielding of a DC-DC converter is highly desirable.

The fundamental frequency of the rectangular switching waveform is typically in the 1 to 10 MHz range. Inductor 102 and bypass capacitor 404 perform an important filtering function that results in the generation of a DC voltage V2 that appears at circuit output node 403. As a result of the filtering, only a small amount of alternating voltage component commonly referred to as "ripple voltage" remains superimposed on the DC component of voltage V2. This ripple voltage is typically in the 10 mV range. Consequently, circuit node 403 does not generate any significant electro-magnetic interference (EMI). It can be stated that since node 403 is connected to large value capacitor 404, node 403 is essentially at AC ground voltage.

Circuit node 407 however, is a major source of EMI; therefore it is desirable to shield it including all associated conductive circuit paths, including the inductor 102 and the semiconductor die 101. With reference to FIG. 3, the EMI shield 302 connected to inductor terminal 201 at connection point 304, and insulating conformal coatings 301 and 303 are also schematically represented in FIG. 4. The EMI shield 302 (FIG. 4) is electrically connected to output 403 at connection point 304.

Figure 5:
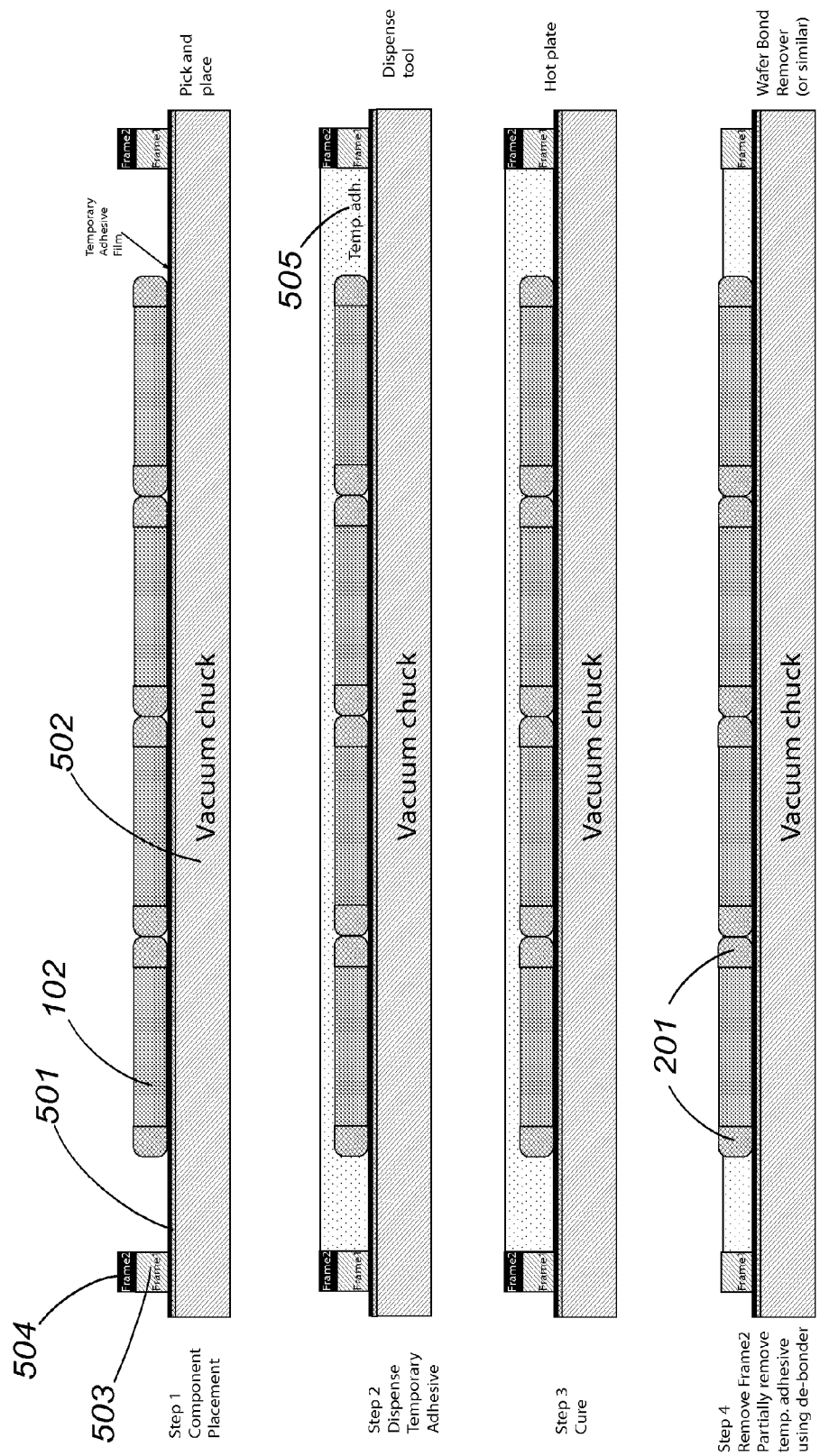
FIG. 5 is a cross-sectional schematic illustration of the initial steps of the 3D-PLP fabrication technique used for the mass production of the exemplary DC-DC buck converter package shown in FIGS. 2 and 3.
Figure 7:
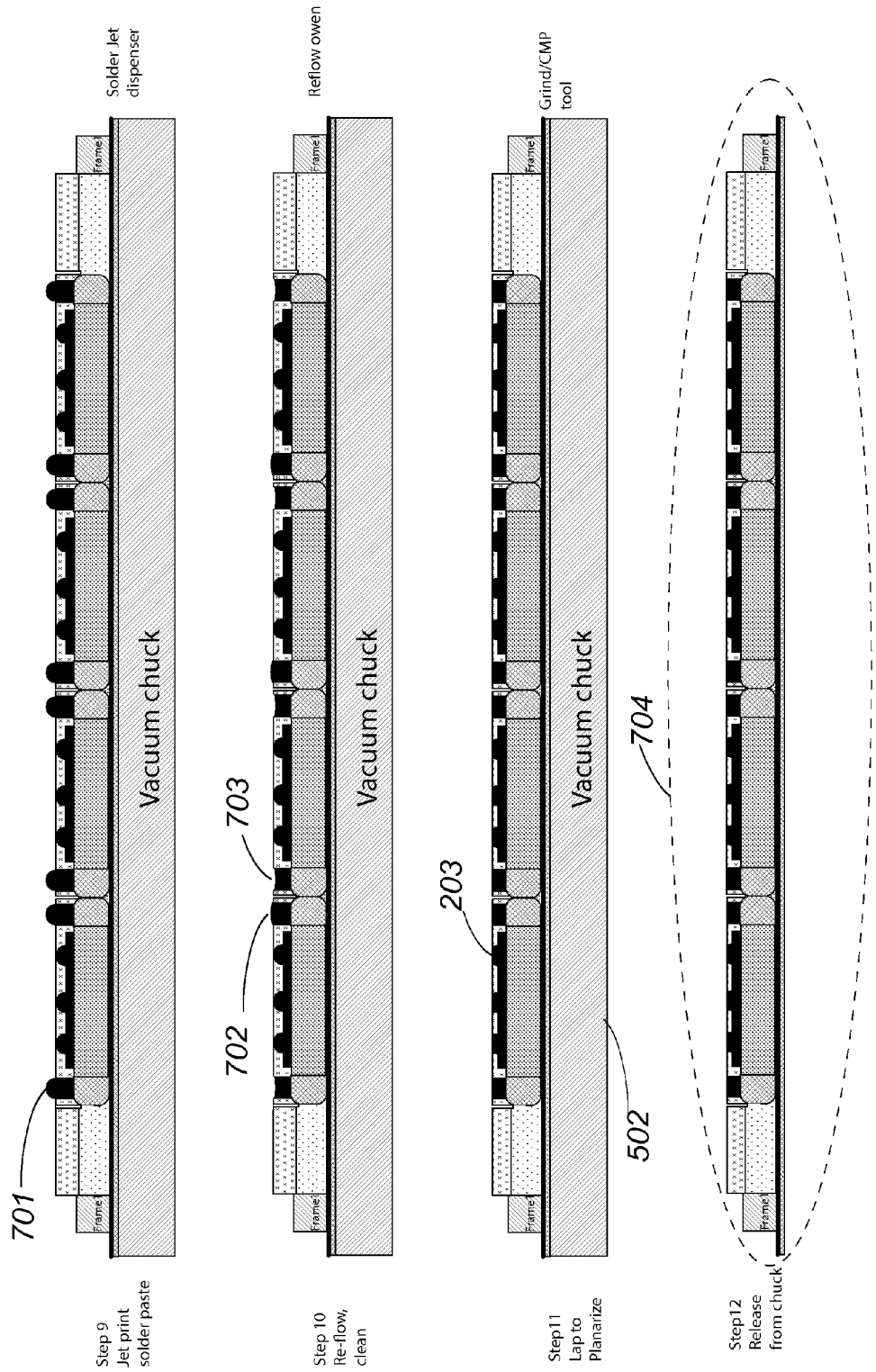
FIG. 7 is a cross-sectional schematic illustration of the subsequent steps of the panel-level packaging mass production fabrication techniques of solder dispense, re-flow, and chemical-mechanical grind/polish (CMP) processing steps.
Figure 8:
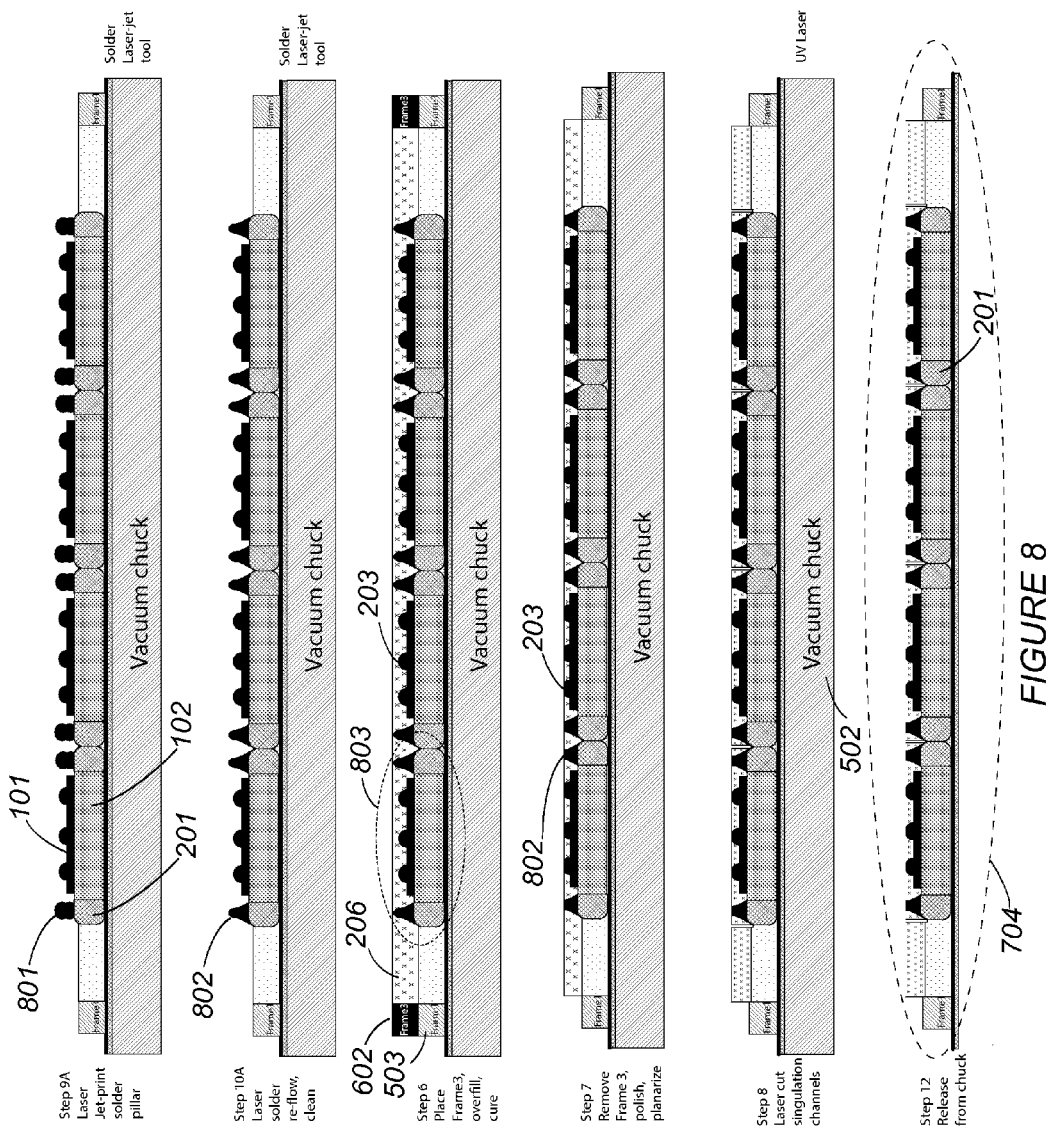
FIG. 8 is a cross-sectional schematic illustration of alternative subsequent steps (9A and 10A) of the panel-level packaging mass production fabrication techniques of solder dispense, re-flow, and chemical-mechanical grind/polish (CMP) processing steps.
Figure 9:
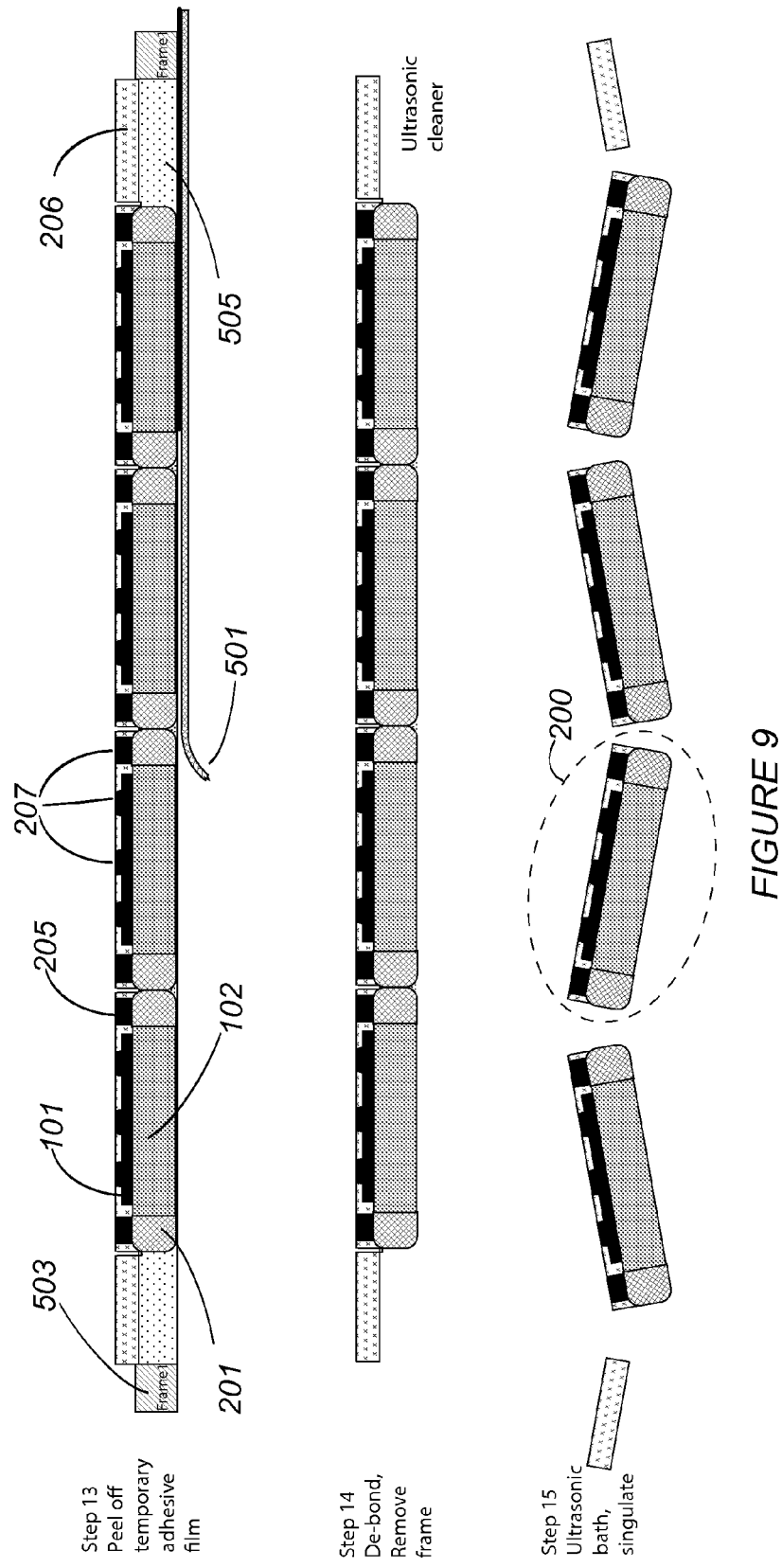
FIG. 9 is a cross-sectional schematic illustration of the chemical singulation process steps of the panel-level packaging mass production fabrication techniques.

Turning to FIGS. 5-9, the steps of the 3D-PLP panel-level packaging fabrication technique are illustrated and described in context of mass-producing the DC-DC 'buck' converter package illustrated in FIG. 2, beginning at the top of FIG. 5 and continuing down image step-by-image step to the bottom of FIG. 9.

In FIG. 5, beginning at Step 1 at the top, an initial component array of the inductors 102, having the larger perimeter of the two package components (the inductor 102 vs. the semiconductor die 101 of FIG. 2) are placed, and secured on an adhesive film 501 having a non-adhesive back, supported on a planar surface of a vacuum chuck 502. The initial array components 102 (the inductors) may be tightly packed or spaced. Placement and arrangement of the initial array component 1 can be accomplished any a number of different approaches, using magnetic, gravity feed, or mechanical (pick-and-place) systems. For example, a tape and reel dispenser may be used to place rows of the initial array component 102 on a flat surface that can be organized into an ordered array of rows and columns. Once the desired array is established, the adhesive film 501, held by the vacuum chuck 502, may be placed over the initial array component, and pressed downward with sufficient force to ensure that each initial array component is firmly attached to the adhesive film whereupon the vacuum chuck 502 can be lifted and turned over with the initial array components 102 secured together by the adhesive film 501 and supported by the vacuum chuck 502. Once the initial component array is secured, it is fenced by two stacked containment frames, a base frame 503 (Frame 1) and an immersion frame 504 (Frame 2). The base frame 503 has a height at most equal to that of the initial array component 501, and is secured by the adhesive film 501. The immersion frame 504 is attached on top of base frame 503 to increase the elevation of the containment fence to well above that of the initial array components 102.

The initial component array is then immersed (FIG. 5, Step 2) in a liquid-phase, temporary bonding material 505, such as WaferBOND® HT-10.10 developed and offered by Brewer Science, Inc. Suitable liquid UV-curable temporary bonding/adhesive materials are also available from 3M Company, e.g., its LC-Series Liquid UV-Curable Adhesives. The liquid-phase, temporary bonding material 505 is dispensed into the fenced initial component array to a elevation above the initial component array up to that of the top immersion frame 504 using any dispensing tool capable of handling the viscosity and thermal properties of the particular liquid phase bonding material 505 chosen. Such systems include spin on, pour and squeegee, capillary, immersion. The objective is to encapsulating the immersed initial component array secured by the adhesive film 501 resting on the vacuum chuck 502 in the liquid-phase, temporary bonding material 505 without bubbles.

The encapsulating liquid-phase, temporary bonding material 505 is then appropriately cured (Step 3) by heating and/or UV-exposure to form a solid, preferably rigid base panel layer consisting of a matrix of cured temporary bonding material and the encapsulated initial array components 102.

The containment frame 504 is then removed (Step 4) to allow a top layer of the temporary bonding material 505 to be removed using either conventional chemical-mechanical grind/polish (CMP) procedures or sop-and-wipe procedures with an appropriate de-bonder solution for exposing the top faces of, and any terminals 201 on the top faces of the initial array components 102 (inductors) encapsulated in the base panel layer.

Figure 6:
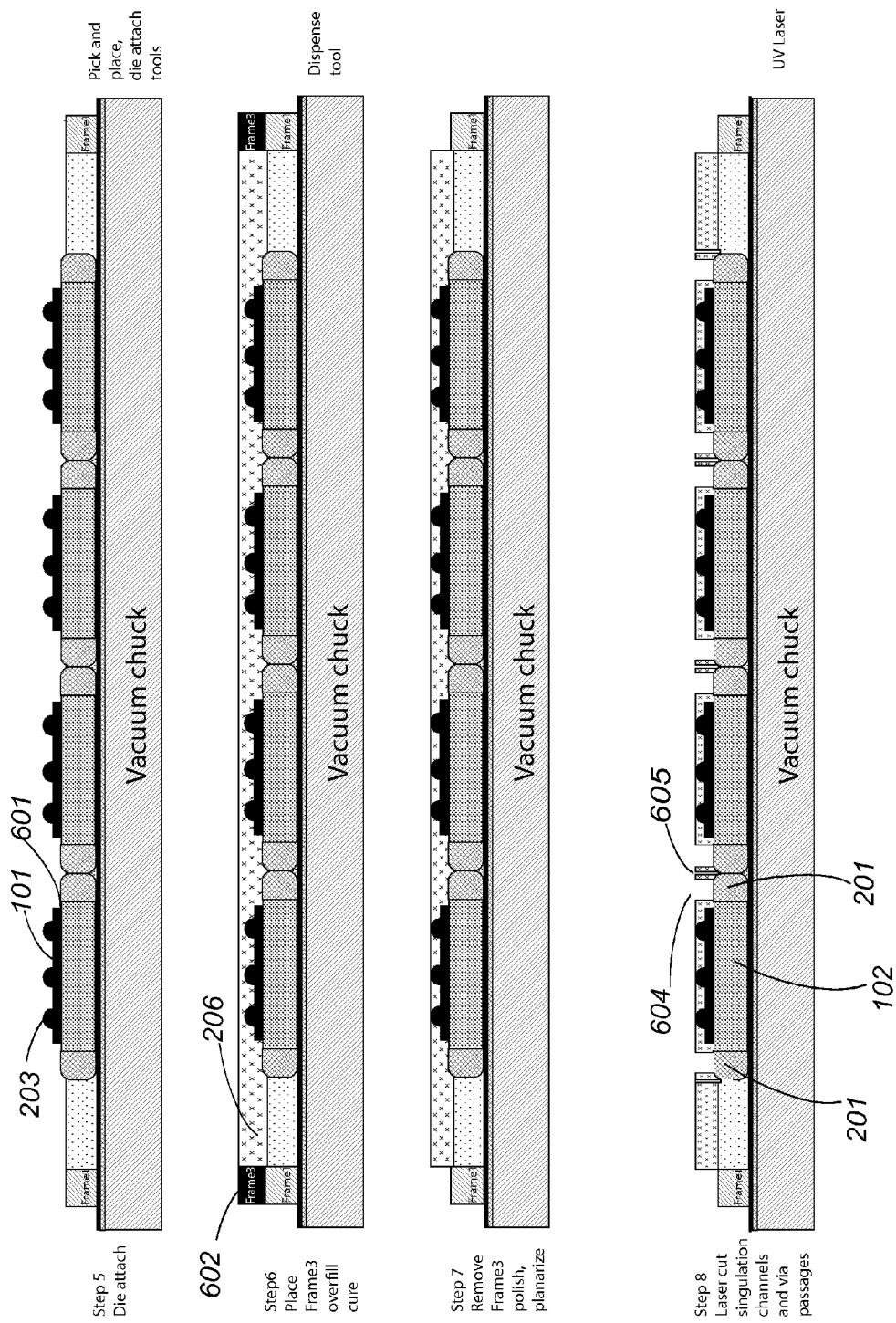
FIG. 6 is a cross-sectional schematic illustration of subsequent die attach, encapsulation, planarization and laser ablation of intersecting singulation channels steps of the panel-level packaging mass production fabrication technique.

Going to FIG. 6, the passive-back face 601 of a semiconductor controller die 101 (the smaller perimeter electronic component) with solder bump terminal interconnects 203 shown in this particular example is conventionally attached and bonded (Step 5) using a conventional non-conductive, die-attach material onto each exposed top face of each encapsulated initial array component 102 creating a second component array bonded to the encapsulated components in the initial component array. Many different types of semiconductor dies are suited for bonding onto exposed top faces of such initial array components encapsulated in the rigid base panel layer of temporary bonding material other than those illustrated, including CSP semiconductor dies having terminals pads greater 5 μm thick Cu, or Cu pillar interconnects 203 (shown in FIG. 2).

The second component array is then fenced with a third containment immersion frame 602 (Frame3) secured on top of the base frame 503 (Frame1), for increasing the containment elevation of the re-established liquid containment fence that extends above that of the bump interconnects 203 extending up from the semiconductor controller die 101. Once fenced, the second component array is immersed (Step 6) in a conventional liquid-stage, permanent, electrically insulating, bonding (under-fill) material 206 that is then conventionally cured, creating a second panel-layer bonded on top of the base panel-layer.

The immersion frame 602 is then removed to allow an initial top layer of the permanent bond material of the second panel layer to be removed (Step 7) using conventional chemical-mechanical grind/polish (CMP) procedures grind/polishing down to a depth just sufficient to remove and planarize the tops of the solder bump interconnects 203.

Via passages 604 are then laser ablated (Step 8) through the second panel layer of permanent bond material for exposing each terminal 201 at each end of each initial array inductor component 102 encapsulated in the base panel layer preferably using an automated laser system functionally designed to sense and stop ablation upon encountering a solder or copper surface. Intersecting singulation channels 605 may also be laser ablated at this point penetrating down through the second panel layer of permanent bonding material to the underlying top surface of the base panel layer of temporary bonding material, preferably appropriately located equidistant between adjacent sides of the underlying initial array (larger perimeter) components 102 encapsulated in the base panel layer. However, in most circumstances ablation of singulation channels 605 can wait preferably until after a final surface grind/CMP step as illustrated in FIGS. 6 & 7 primarily because debris created in subsequent steps can accumulate in such channels and cause problems.

Going to FIG. 7, solder paste 701 is dispensed (Step 9) into via passages 604 (FIG. 6), by means of a suitable solder paste jet printing system such as the MY500 Jet Printer offered by Micronic MYDATA Automation, Inc. 320 Newburyport Turnpike Rowley, Mass. 01969.

The amount of deposited solder paste 701 should preferably overfill via passages such that upon re-flow (Step 10), the re-flown and then solidified solder via will preferably slightly overfill the via passages 702. In the worst case (as illustrated), the dispensed quantity of solder paste should be sufficient to ensure only a slight under-fill of the via passageway by the solder 703 after re-flow. Upon completion of the solder re-flow step, a final surface grind/CMP step is performed (Step 11) truncating the solder vias and solder bumps 203 and planarize the top surface of the second panel layer with exposed coplanar terminals. Depending upon specific details of the manufacturing process, opening of singulation channels 605 (FIG. 6) by means of laser ablation may be performed after completion of the final surface grind/CMP step. Upon completion of Step 12, the PLP panel 704 is released from vacuum chuck 502.

FIG. 8 illustrates alternative steps for creating solder vias connecting to the inductor terminals 201 of the initial array components 102 (the inductor) after die attach and bonding the second array components 101 (the semiconductor controller dies) to the initial array components 102 (the inductor) and before creation of the second panel layer (as illustrated in (Step 6 of FIG. 6). The alternative steps are applied following the completion of Steps 1 through 5. In this alternative flow, solder paste pillars 801 are jet deposited (Step 9A) onto the exposed terminals on the top surface the base panel layer of the initial array components 102 (the inductors) to an elevation well above the solder bumps 203 of the die 101 and subsequently reflowed. Alternative Step 9A in FIG. 8 follows Step 5 in FIG. 6 of the original manufacturing flow. Alternative Step 9A in FIG. 8 replaces Steps 9 of FIG. 7 in the original manufacturing flow. Alternative Step 9A of FIG. 8 is followed by alternative Step 10A.

Alternative Step 10A replaces Step 10 of FIG. 7 in the original manufacturing flow. In alternative Step 10A (FIG. 8) laser-induced solder reflow is applied in order to selectively heat and reflow solder paste pillars 801, thus forming solidified solder pillar 802 after the reflow step has been completed. A cleaning step is applied upon completion of the reflow step. Alternative Step 10A of FIG. 8 is followed by Step 6.

Step 6 of FIG. 8 is similar to Step 6 of FIG. 6 of the original manufacturing flow: The first and second component array 803 is fenced with a second containment immersion frame 602 (Frame3) secured on top of the base frame 503 (Frame1), for increasing the containment elevation of the re-established liquid containment fence that extends above that of the solder pillars 802 and bump interconnects 203 extending up from the semiconductor controller die 101. Once fenced, the first and second component array 803 is immersed in a conventional liquid-stage, permanent, electrically insulating bonding (under-fill) material 206 that is then conventionally cured, creating a second panel-layer bonded on top of the first (base) panel-layer.

It should be appreciated that at this point in the fabrication cycle, the second panel layer permanent, electrically insulating, bonding (under-fill) material bonds both to the secondary components and to the exposed top faces of the underlying initial array components, outside the perimeters of the second array component creating a rigid two panel layer structure.

Step 7 of FIG. 8 is similar to Step 7 of FIG. 6 of the original manufacturing flow: A top layer of the cured permanent, electrically insulating, bonding material is removed in a final surface grind/CMP step (Step 7) to both: (i) planarize the top surface of the second panel, and to (ii) truncate the solder vias 802 and solder bumps 203, thus creating second panel layer with coplanar surface terminals connecting to the underlying second and initial array components (the semiconductor controller die 101 and inductor 102).

Step 8 of FIG. 8 is similar to Step 8 of FIG. 6 of the original manufacturing flow, however, only the intersecting singulation channels need to be laser ablated into and through the second panel layer of the penetrating down to the base panel layer of the temporary bonding material along and between adjacent sides of the initial array components 102. The laser ablating system is chosen to have the capability to stop ablation when reaching the underlying metal surface of inductor terminals 201.

Step 12 of FIG. 8 is similar to Step 12 of FIG. 7 of the original manufacturing flow: The PLP panel 704 is released from vacuum chuck 502.

Alternative flow Step 12 of FIG. 8 and Step 12 of FIG. 7 of the original manufacturing flow complete the construction of array of three-dimensional packages of DC-DC 'buck' converters 200 (FIG. 4).

Reaching FIG. 9, the temporary adhesive film 501 is removed (peeled) from the bottom of the base panel layer exposing bottom faces and the coplanar terminals on the bottom faces of the initial array components, namely the bottom sides of the end terminals 201 of the inductors 102. Also, the containment base frame 503 may be removed.

The rigid two-panel layer structure is then immersed in an ultrasonic bath of a suitable de-bonding solution, preferably composed of one or more solvents of the liquid-phase, temporary bonding material, e.g., WaferBOND® HT-10.10 developed and offered by Brewer Science, Inc. for dissolving the temporary bonding material 505 encapsulating the initial array components 102 (inductors) in the base panel layer singulating and scrubbing the constructed three-dimensional packages 200 (the DC-DC 'buck' converters).

The resulting three-dimensional hexahedral structure of the singulated packages 200 (as illustrated in FIG. 2) consists of an initial array component (the inductor 102) with exposed end terminals 201 bonded to a second array component 101 (the semiconductor controller die) by the permanent, electrically insulating, bonding material 206 of the second panel layer, with a pair of conductive vias 205 communicating through the permanent, electrically insulating, bonding material 206 of the second panel layer each connected to one of the end terminals 201 of the inductor 102 providing coplanar terminals face 207 for interconnecting the controller die 101 and inductor 102 for functionally receiving input voltage from, and providing output voltage to external circuitry elements of the particular electronic system (FIG. 4).

Figure 10:
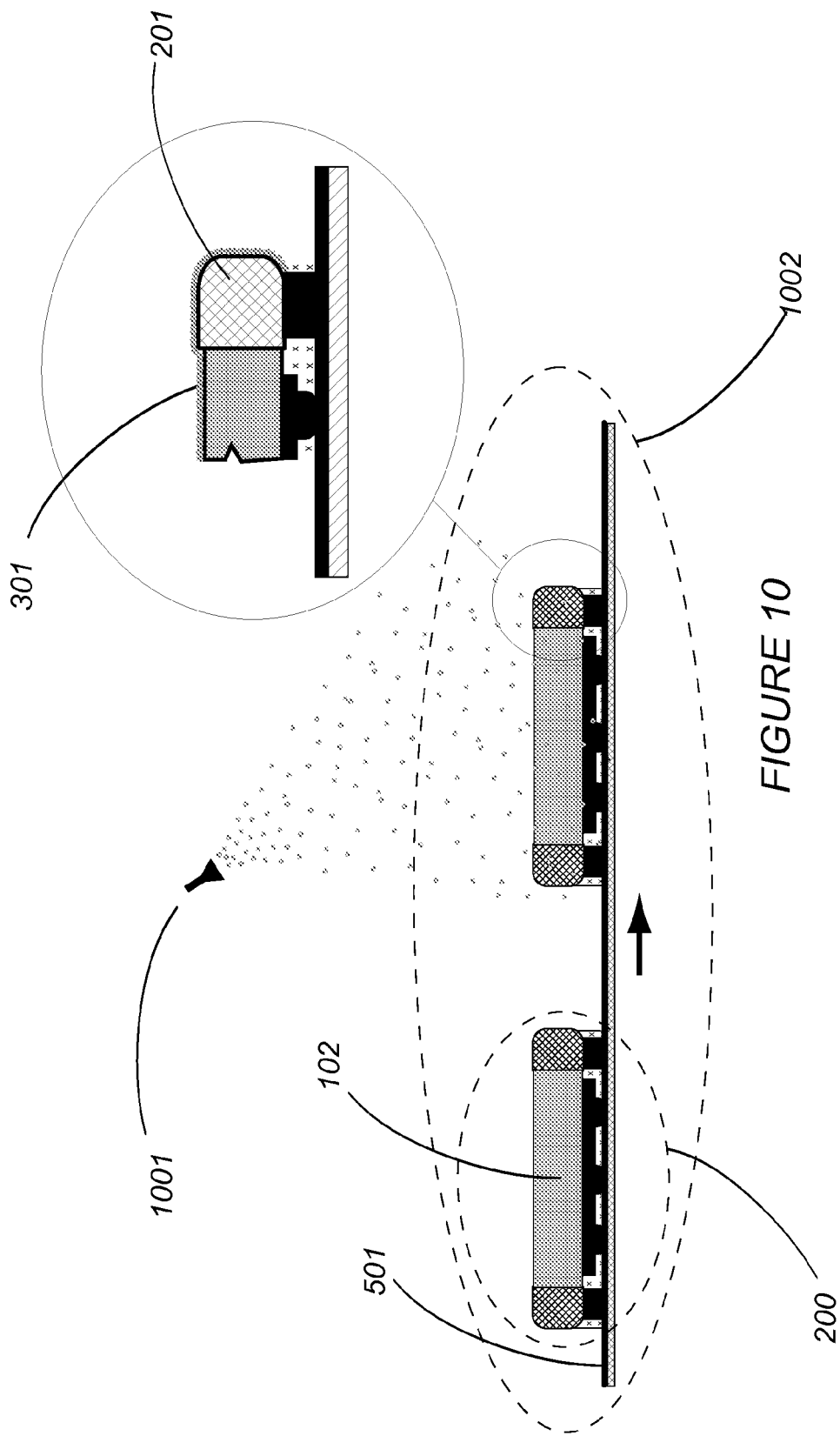
FIG. 10 is a cross-sectional schematic illustrating application of an optional step of conformal coating following singulation of the constructed three-dimensional component packages.

Turning now to FIG. 10, the constructed hexahedral component package 200 may need to have an insulated conformal coating 301 to preclude possible electrical shorts between any exposed conductive surfaces of the package 200 and other electrically conductive surfaces due to moisture and otherwise, of the particular electronic system, e.g., the end terminals 201 of the inductor 102 of the illustrated package 200. Preferably, such conformal insulative coatings should be resilient, and hard enough to resist deformation and puncture.

Various different conventional methods are suitable coating the three-dimensional component hexahedral packages 200 including dipping, spin coating and spray coating. In more detail, the hexahedral component packages 200 are arranged in a spaced array configuration 1002 on the adhesive surface of temporary adhesive film 501 with the inductor component 102 facing up (on top). The temporary adhesive film 501 rests upon and held firmly by a vacuum chuck 502 (not shown), as previously described in FIG. 5. Temporary adhesive film 501 also serves as mask to prevent the insulative layer from coating the active electrical terminals of the hexahedral component packages 200. The spaced array configuration 1002 is then spray coated using spray head 1001.

Figure 11:
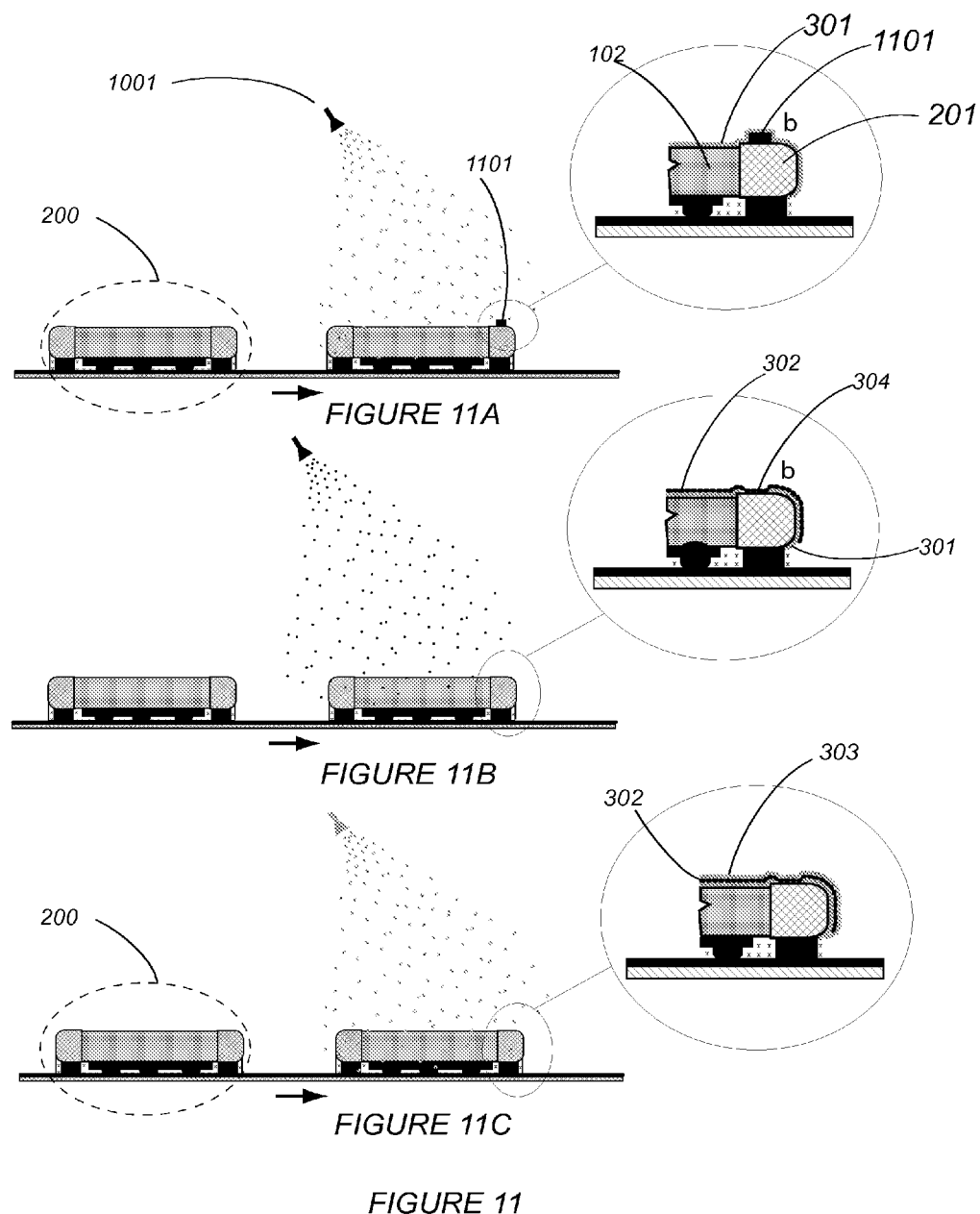
FIG. 11A is a cross-sectional schematic illustration of an optional step of applying an initial conformal coating the three dimensional DC-DC buck converter package of FIG. 2 partially masked.
FIG. 11B is a cross-sectional schematic illustration of subsequent optional step of applying an EMI shield coating on the coated three-dimensional DC-DC buck converter package of FIG. 11A.
FIG. 11C is a cross-sectional schematic illustration of the optional step of applying the final conformal coating on the exemplary three dimensional, DC-DC buck converter package of FIGS. 2 & 3.

In more detail, turning to FIGS. 11A-11C, a mask 1101 is placed over one of the two inductor terminals 201 of the of each hexahedral component package 200 in the array prior to the application of the first insulated conformal coating. The inductor terminals 201 receiving the mask 1101 will be externally connected to large bypass capacitors 404 (not shown), as outlined on circuit schematic of FIG. 4. Then as indicted by FIG. 11A, the array of hexahedral component packages 200 is spray-coated with a first insulative conformal coating layer 301.

In FIG. 11B, the masks 1101 (of FIG. 11A) have been removed from the terminals 201 of the hexahedral component packages 200 in the array which are then are spray coated with a second conformal electromagnetically conductive shield coating 302 covering the first insulating conformal coating 301. The electromagnetically conductive shield coating 302 is electrically connecting with the particular inductor terminal 201 of each hexahedral component package 200 in the array at the point 304 were the electrically conductive inductor terminal surface 201 is exposed as a result of a previously described masking step 1101 (FIG. 11A).

In FIG. 11C a third conformal insulative spray-coating 303 is applied to the covering the second electromagnetically conductive shield coatings 302 of the array of hexahedral component packages 200 to preclude potential short circuits due to contact conductive shielded of hexahedral component packages 200.

Figure 12:
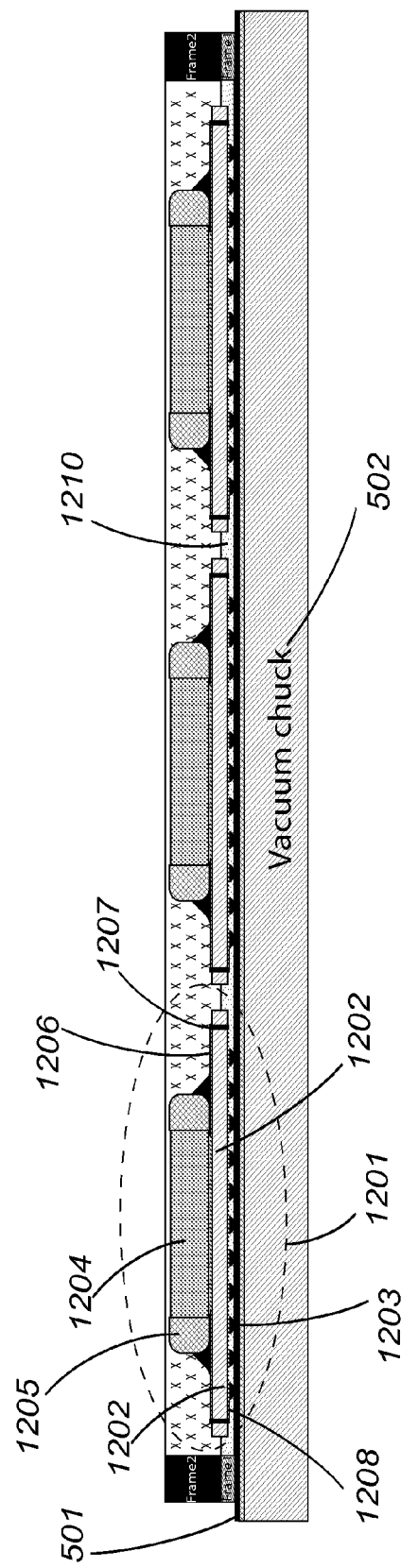
FIG. 12 is a cross-sectional schematic for showing of the initial steps of exemplary panel-level packaging fabrication technique for mass-producing an exemplary three-dimensional component incorporating three stacked electronic components.

FIG. 12 shows initial steps of exemplary panel-level packaging fabrication technique for mass-producing an exemplary two panel layers, three-dimensional component 1201. Here the initial array component is a large perimeter, flat semiconductor die 1202 with active face 1203 having solder bumps mounted upon secured by an adhesive film 501 with the solder bump interconnects 1203 firmly embedded in the film adhesive.

The second array component is a smaller perimeter, passive electrical component 1204 (inductor) with two terminals 1205, one each end is conventionally bonded using a conventional non-conductive die-attach material onto the passive back face 1206 of each semiconductor die 1202. The end terminals 1205 of each hexahedral inductor 1204 electrically connect to conductive vias 1207 through each semiconductor die 1202 and conductive traces/paths 1208 on the front active face 1204 and on the passive back face of each particular die 1202 for functionally receiving input and providing output voltages to the underlying semiconductor die 1202.

There are one or more suitable combinations of panel-level packaging techniques for fabricating such multiple electronic components packages, any one of which might be employed to address different parameters functionalities and features of the particular component package desire to be assembled in the package. For example, as shown schematically in FIG. 12, the base panel layer might comprise the array of larger perimeter, semiconductor dies 1202 with their solder bump interconnects 1203 firmly embedded in a dissolvable viscous temporary bonding material 1210 that is subsequently cured with array of semiconductor dies 1202 resting on the top surface of the film 501 held in place by a vacuum chuck 502. The second panel layer might comprise a layer of a permanent, electrically insulative bonding material encapsulating the second array of passive electrical components 1204. Accordingly, in this instance intersecting laser ablation channels (not shown) would penetrate down the top surface of the cured bonding material. The component packages 1201 would then be similarly singulated and cleaned by placing the created 2-panel structure into an ultrasonic bath of suitable de-bonding solution(s).

Alternatively, the base panel layer might comprise a temporary bonding material encapsulating both the initial array of larger perimeter semiconductor dies 1202 and the second array of passive electrical components 1204 permanently bonded to the passive back faces 1206 of the larger perimeter semiconductor dies 1202. The component packages 1201 would then be similarly singulated and cleaned by placing the created 2-panel structure into an ultrasonic bath of suitable de-bonding solution(s).

It should be recognized that skilled engineers and designers in fields associated with manufacture of integrate circuit devises can specify different steps for, and different configurations of 3-dimensional of electronic packages suited to panel-level-package fabrication of electronic components including integrated semiconductor circuits that will accomplish same functions, in substantially the same way, to achieve substantially the same results as those techniques described and specified above. Similarly, the respective elements described for effecting the desired functionality of achieved by may be configured differently, per constraints imposed by different circuitry systems, yet perform substantially the same function, in substantially the same way, to achieve substantially the same result as those components described and specified by the Applicant above. Accordingly, while mechanical components suitable for implementing the describe techniques may not be exactly described herein, they may fall within the spirit and the scope of patentable invention as described and set forth in the appended claims.

I claim:

1. A panel-level package technique for fabricating a plurality of small, three dimensional, active and small passive electronic component packages, comprising the steps of:
   a) placing a regular, initial array of a larger perimeter planar electronic component having coplanar terminals on a temporary adhesive film supported on a planar surface;
   b) immersing the initial array of the larger components in a liquid phase, temporary bonding material;

c) curing the temporary bonding material for creating a base panel layer encapsulating and securing the initial array of the larger perimeter planar components;

d) removing a top layer of the cured, temporary bonding material from the base panel layer to expose top faces of, and any coplanar terminals presented on the top faces of the initial array of the larger perimeter planar electronic component;

e) placing and attaching a second smaller perimeter, planar component presenting coplanar terminals on each exposed top face of the larger perimeter coplanar components encapsulated in the base panel layer;

f) forming a stand-alone solid solder pillar on each terminal of the larger component in the base panel exposed on the top face of the base panel layer outside the perimeter of each attached second smaller perimeter planar component extending upward to an elevation above any coplanar terminals on top faces of the array of attached second smaller perimeter planar component;

g) immersing the solder pillars and the second smaller perimeter, planar components in a liquid phase permanent, electrically insulating, bonding material of initial array of the larger perimeter planar components encapsulated in the base panel layer;

h) curing the layer of permanent, electrically insulating, bonding material panel layer of a encapsulating the array second smaller perimeter planar components and solder pillars permanently bonded to the regular array of the larger perimeter planar components held in the cured, temporary bonding material of the base panel layer;

i) removing a top layer of the cured, second panel layer of permanent, electrically insulating, bonding material for (A) establishing a perimeter planar top surface, (B) exposing coplanar end faces of the solder pillars establishing via connections electrically connected to the terminals on the top faces of the larger perimeter planar components, and (C) exposing any terminal faces presented on the top surface of the second smaller perimeter planar component forming a regular array of small, three-dimensional electronic component packages encapsulated in the permanent, electrically insulating, bonding material of the second panel layer bonded to the temporary bonding material of the base panel layer;

j) ablating intersecting singulation channels through the second panel layer along each side of each small, three dimensional electronic component packages, penetrating down to the top surface of the base panel layer of temporary bonding material;

k) lifting the base and second planer layers of encapsulated three dimensional electronic component packages from the supporting perimeter planar surface;

l) removing the temporary adhesive film from a bottom surface of the base panel layer of temporary bonding material exposing bottom faces and any coplanar terminals on the bottom faces of the initial array of the larger perimeter planar components; and m) dissolving and removing the base panel layer of temporary bonding material for singulating the three dimensional, electronic component packages permanently bonded together by the permanent, electrically insulating, bonding material.

2. A panel-level package technique for fabricating a plurality of small, three dimensional, active and small passive electronic component packages, comprising the steps of:

a) placing a regular, initial array of a larger perimeter planar electronic component having coplanar terminals on a temporary adhesive film supported on a planar surface;

b) immersing the initial array of the larger components in a liquid phase, temporary bonding material;

c) curing the temporary bonding material for creating a base panel layer encapsulating and securing the initial array of the larger perimeter planar components;

d) removing a top layer of the cured, temporary bonding material from the base panel layer to expose top faces of, and any coplanar terminals presented on the top faces of the initial array of the larger perimeter planar electronic component;

e) placing and attaching a second smaller perimeter, planar component presenting coplanar terminals on each exposed top face of the larger perimeter coplanar components encapsulated in the base panel layer;

f) encapsulating the second smaller perimeter planar components placed on and attached to the exposed faces of the array of the larger perimeter planar components in the base panel layer within a layer of permanent, electrically insulating, bonding material;

g) curing the layer of permanent, electrically insulating, bonding material creating a second panel layer of a regular array of the second smaller perimeter, planar components bonded to the regular array of the larger perimeter planar components held in the cured, temporary bonding material of the base panel layer;

h) ablating via passages to each terminal of the larger component in the base panel on the top face of the base panel layer outside the perimeter of each attached second smaller perimeter planar component extending upward to an elevation above any coplanar terminals on top faces of the array of attached second smaller perimeter planar component;

i) depositing solder paste into each terminal via passage of the larger component in the base panel exposed on the top face of the base panel layer outside the perimeter of each attached second smaller perimeter planar component extending upward to an elevation above any coplanar terminals on top faces of the array of attached second smaller perimeter planar component;

j) heating the base and second panel layers for reflowing the solder paste pillars for establishing electrical metallurgical solder via connections to the exposed terminals of the first perimeter planar component on the top surface of the base panel layer of temporary bonding material;

k) removing a top layer of the cured, second panel layer of permanent, electrically insulating, bonding material for (A) establishing a perimeter planar top surface, (B) exposing coplanar end faces of the solder via connections electrically connected to the terminals on the top faces of the larger perimeter planar components, and (C) exposing any terminal faces presented on the top surface of the second smaller perimeter planar component forming a regular array of small, three-dimensional electronic component packages encapsulated in the permanent, electrically insulating, bonding material of the second panel layer bonded to the temporary bonding material of the base panel layer;

l) ablating intersecting singulation channels through the second panel layer along each side of each small, three dimensional electronic component packages, penetrating down to the top surface of the base panel layer of temporary bonding material;

m) lifting the base and second planer layers of encapsulated three dimensional electronic component packages from the supporting perimeter planar surface;

n) removing the temporary adhesive film from a bottom surface of the base panel layer of temporary bonding material exposing bottom faces and any coplanar terminals on the bottom faces of the initial array of the larger perimeter planar components; and o) dissolving and removing the base panel layer of temporary bonding material for singulating the three dimensional, electronic component packages permanently bonded together by the permanent, electrically insulating, bonding material.

3. The panel-level package technique of claim 1 or claim 2 for fabricating a plurality of small three dimensional active and passive electronic component packages wherein the larger perimeter planar component of the initial array comprises small passive perimeter planar electrical circuit component having coplanar terminals on opposite ends, and the second smaller perimeter planar component comprises an active controller die having a passive-back, bottom face and terminals extending up from a top face where the passive-back, bottom face of each controller die is placed on and attached to each exposed a top face of the small, passive, perimeter planar, electrical circuit component, and the terminals extending up from the top face of the dies are exposed on the planar top surface of the permanent, electrically insulating, bonding material of the second panel layer.

4. The panel-level package technique of claim 1 or claim 2 for fabricating a plurality of small three dimensional active and passive electronic component packages wherein:
   (i) the larger perimeter planar component in the initial array comprises a first, planar, active semiconductor die each presenting a top, planar passive-back face, and a bottom face with coplanar terminals that is placed bottom face down on the temporary adhesive film supported on the planar surface to create the initial array of the larger perimeter, planar component that are encapsulated in the cured, temporary bonding material with their passive-back faces exposed in on the top surface of the base panel layer; and
   (ii) the second smaller perimeter planar components comprises a passive electrical circuit component having coplanar terminals at opposite ends where a bottom face of each passive electrical circuit component is placed on and bonded to each of the passive-back faces exposed in the initial array of the larger perimeter, semiconductor die component encapsulated in the base panel layer of cured temporary, bonding material.

5. The panel-level package technique of claim 1 or 2 for fabricating a plurality of small hexahedral three dimensional switch-mode DC-DC converter packages wherein:
   (A) the larger perimeter planar component in the initial array comprises a hexahedral inductor having coplanar terminals at opposite ends adapted to form electrical metallurgical connections with reflowed solder paste;
   (B) the second smaller perimeter planar component comprises an circuit controller semiconductor die having a planar passive-back face opposite an active face presenting extending terminals where the passive back face of each semiconductor die is attached to the exposed top face of each inductor in the initial array between the coplanar terminals of the inductor; and
   (C) the removal of the top layer of the cured, second panel layer of permanent, electrically insulating, bonding material establishes a planar top surface with exposed coplanar active terminals faces extending up from the semiconductor die, and exposed coplanar end faces of the solder via connections extending up from the terminals on the top faces of the inductors.

6. The panel-level package technique of claim 5 for fabricating a plurality of small three dimensional DC-DC converter packages wherein a solder jet printer system deposits the solder paste pillars for reflow for establishing solder via connections.

7. The panel-level package technique of claim 6 for fabricating a plurality of small, hexahedral three dimensional DC-DC converter packages further including the steps of:
   aa) placing a plurality of the singulated switch-mode DC-DC converter packages with the exposed coplanar terminal faces of the package extending from the semiconductor die and end faces of the solder via connections extending up from the terminals of the inductor face down in a spaced array, on an adhesive film supported by a transportable carrier surface; and
   bb) coating the remaining hexahedral faces of the small, hexahedral three dimensional switch-mode DC-DC converter packages in the spaced array with an initial thin layer of electrically insulating material;
   where the adhesive film covering the terminal faces and end faces of each package is removed when it is incorporated into circuitry of a compact thin electronic device.

8. The panel-level package technique of claim 7 for fabricating a plurality of small, hexahedral three dimensional switch-mode DC-DC converter packages further including the step of:
   cc) coating the remaining hexahedral faces of the small, hexahedral three dimensional DC-DC converter packages in the spaced array with a second thin layer electromagnetic shielding material over the initial thin layer of electrically insulating material;
   dd) electrically connecting the second thin layer electromagnetic shielding material to a circuit node that is free of any substantial AC component (virtual ground).

9. The panel-level package technique of claim 8 for fabricating a plurality of small, hexahedral three dimensional DC-DC converter packages further including the step of:
   ee) coating the remaining hexahedral faces of the small, hexahedral three dimensional switch-mode DC-DC converter packages in the spaced array with a third thin layer of electrically insulating material covering second thin layer of electromagnetic shielding material.

10. A panel-level package technique for fabricating a plurality of small, three dimensional, active and passive electronic component modules comprising the steps of:
    a) creating a regular array of larger face-area components consisting of either:
       (i) a small passive electrical circuit hexahedral component having flat opposite faces with coplanar terminals at opposing ends, or
       (ii) a small flat, active semiconductor die components presenting active terminal faces in a plane opposite a passive-back face,
    face down on a temporary adhesive film supported on a planar surface, for orienting the opposing faces of the larger face-area components in a common plane;
    b) encapsulating the regular array of the larger face-area components in a temporary bonding material supported on the planar surface;
    c) curing the first temporary bonding material creating a base panel layer of an array of the larger face-area components immersed and held in cured, temporary bonding material;
    d) removing a top layer of the cured, temporary bonding material of the base panel layer above the plane of the opposing faces of the ordered array of the larger face-area for exposing the plane opposing faces of the array of larger face-area components on a top surface of the base panel layer;

e) attaching a the smaller face-area component of either (i) one of the small passive electrical circuit component, or (ii) one of the small flat, active semiconductor die components, on each exposed face of the array of larger face-area components on top surface of the base panel layer;

f) encapsulating the array of the smaller face-area components attached to the faces of the array of the larger face-area components in the base panel layer in a layer of permanent, electrically insulating, bonding material;

g) curing the second layer of permanent, electrically insulating, bonding material to create a second panel layer of an array of the smaller face-area components permanently bonded to the larger face-area components held in the cured, temporary bonding material of the base panel layer;

h) removing an initial top layer of the cured, second panel layer of permanent, electrically insulating, bonding material extending down to an elevation proximate any terminals of the smaller face-area components;

i) ablating an array of via passages through the cured, second layer of electrically insulating, permanent bonding material for exposing terminals of the larger face-area components in the base panel layer below the second panel layer and active terminal faces of the smaller face-area components covered by the cured, second layer of electrically insulating, permanent bonding material;

j) depositing a pillar of solder paste filling each via passage ablated through the cured second layer of permanent, electrically insulating, bonding material to an elevation above each via passageway such that upon heating and reflow, solidified solder fills the via passages;

k) heating the base and second panel layers for reflowing the solder pastes for establishing solder vias metallurgically bonded and electrically connected to each terminals of the larger and smaller face area components;

l) removing a subsequent top layer of the cured, second panel layer of permanent, electrically insulating, bonding material along with top portions of the pillars of solidified solder filling the via passages establishing a planar top surface of a panel of a regular array of small, three dimensional active and passive electronic component modules bonded together by the second layer of permanent, electrically insulating, bonding material and held in the base panel layer of temporary bonding material;

m) ablating intersecting singulation channels penetrating down to the top surface of the base panel layer of temporary bonding material;

n) lifting the panel of a regular array of small three dimensional, active and passive electronic component modules from the supporting planar surface;

o) removing the temporary adhesive film from a bottom surface of the base panel layer exposing the bottom faces of the regular array of the larger face-area components;

p) dissolving and removing the base panel layer of temporary bonding material singulating the small, three dimensional active and passive electronic component modules in the panel of a regular array of small, three dimensional active and passive electronic component modules.

11. The panel-level package technique of claim 10 for fabricating a plurality of very small three dimensional active and passive electronic component modules wherein:
(i) the larger face-area component is a small hexahedral passive electrical circuit having flat top and bottom faces with coplanar terminals at opposing ends; and
(ii) the smaller face-area component is a small flat, active semiconductor die with coplanar terminal faces is the top face opposite a passive-back bottom face.

12. The panel-level package technique of claim 11 for fabricating a plurality of very small, three dimensional, active and passive electronic component modules wherein:
(i) the larger face-area component is a small flat, active semiconductor die that presents a bottom face of active, extending terminals faces and a top passive-back face, and
(ii) the smaller face-area component is a small hexahedral passive electrical circuit component having flat top and bottom faces with coplanar terminals at opposing ends; and
wherein the top layer of the cured, second panel layer of permanent, electrically insulating, bonding material is removed for establishing a planar surface exposing the top faces and terminals at the opposite ends of the array small passive electrical circuit components; and skipping steps j) through l).

13. The panel-level package technique of claim 12 for fabricating a plurality of small three dimensional active and passive electronic component modules where the smaller flat, active semiconductor die has active, raised and flat face terminals and a passive back face, and further including the steps of ablating via passages through the cured, second layer of electrically insulating, permanent bonding material exposing covered active flat face terminals of the second smaller face-area component.

* * * * *